US010219344B2

(12) United States Patent
Rivas et al.

(10) Patent No.: US 10,219,344 B2
(45) Date of Patent: *Feb. 26, 2019

(54) LIGHT EMITTING DIODE DRIVER FOR DIMMING AND ON/OFF CONTROL

(71) Applicant: Allegro MicroSystems, LLC, Manchester, NH (US)

(72) Inventors: Manuel Rivas, Ciudad de Buenos Aires (AR); Gerardo A. Monreal, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/957,004

(22) Filed: Apr. 19, 2018

(65) Prior Publication Data

US 2018/0249545 A1 Aug. 30, 2018

Related U.S. Application Data

(63) Continuation of application No. 15/378,702, filed on Dec. 14, 2016, now Pat. No. 9,999,107.

(51) Int. Cl.
H05B 33/08 (2006.01)
H05B 37/02 (2006.01)
(Continued)

(52) U.S. Cl.
CPC ......... *H05B 33/0854* (2013.01); *G01D 5/145* (2013.01); *G01D 7/00* (2013.01);
(Continued)

(58) Field of Classification Search
CPC .... G01D 5/145; G01D 5/147; G01D 5/24438; G01D 5/2451; G01D 5/142; G01R 33/07;
(Continued)

(56) References Cited

U.S. PATENT DOCUMENTS 5,099,687 A 3/1992 Lunzer et al.
6,028,370 A 2/2000 Lamm et al.
(Continued)

FOREIGN PATENT DOCUMENTS

CN 203057046 U 7/2013

OTHER PUBLICATIONS

PCT International Search Report and Written Opinion dated Apr. 12, 2016 corresponding to International Application No. PCT/US2016/012986; 12 Pages.
(Continued)

*Primary Examiner* — Vibol Tan
(74) *Attorney, Agent, or Firm* — Daley, Crowley, Mofford & Durkee, LLP

(57) ABSTRACT

In one aspect, an integrated circuit (IC) includes a first magnetic field sensor configured to sense a ring magnet, a second magnetic field sensor configured to sense the ring magnet and processing circuitry configured to receive a first signal from the first magnetic field sensor and to receive a second signal from the second magnetic field sensor. The processing circuitry is further configured to control an on/off state of at least one light emitting diode (LED) and brightness of the LED based on movement and position of the ring magnet with respect to the first and second magnetic field sensors.

20 Claims, 8 Drawing Sheets

(51) Int. Cl.
 *G01R 33/07*  (2006.01)
 *G01R 33/09*  (2006.01)
 *G01D 5/14*  (2006.01)
 *G01D 7/00*  (2006.01)
 *G01P 13/04*  (2006.01)

(52) U.S. Cl.
 CPC ......... *G01R 33/077* (2013.01); *G01R 33/093* (2013.01); *G01R 33/098* (2013.01); *H05B 33/0845* (2013.01); *H05B 37/0227* (2013.01); *G01P 13/04* (2013.01)

(58) Field of Classification Search
 CPC ...... G01R 33/077; G01R 33/09; G01R 33/02; G01R 33/06; G01R 33/038; G01R 33/075; G01R 33/1215; G01R 33/023; G01R 33/0035; G01R 33/0206; G01R 33/093; G01R 33/098; G01P 3/487; G01P 3/481; G01P 3/489; G01L 3/101; G01L 3/104; H05B 33/0854
 See application file for complete search history.

(56) References Cited

U.S. PATENT DOCUMENTS

| | | | |
|---|---|---|---|
| 6,356,741 B1 | 3/2002 | Bilotti et al. | |
| 6,622,012 B2 | 9/2003 | Bilotti et al. | |
| 6,982,527 B2 | 1/2006 | Lee et al. | |
| 7,085,119 B2 | 8/2006 | Bilotti et al. | |
| 7,307,824 B2 | 12/2007 | Bilotti et al. | |
| 7,675,245 B2 | 3/2010 | Szczeszynski et al. | |
| 7,982,454 B2 * | 7/2011 | Fernandez | G01D 5/24452 324/207.2 |
| 8,274,238 B2 | 9/2012 | Szczeszynski et al. | |
| 8,337,060 B1 | 12/2012 | Frankovich | |
| 8,339,049 B2 | 12/2012 | Kang et al. | |
| 8,456,105 B2 | 6/2013 | Wang et al. | |
| 8,519,630 B2 | 8/2013 | Wang et al. | |
| 8,664,930 B2 | 3/2014 | Kang et al. | |
| 8,692,482 B2 | 4/2014 | Szczeszynski et al. | |
| 8,742,682 B1 | 6/2014 | Wang et al. | |
| 8,749,005 B1 | 6/2014 | Foletto et al. | |
| 8,901,835 B2 | 12/2014 | Kang et al. | |
| 8,937,433 B1 | 1/2015 | Wang et al. | |
| 9,062,990 B2 | 6/2015 | Petrie | |
| 9,377,285 B2 | 6/2016 | Romero et al. | |
| 9,389,060 B2 | 7/2016 | Romero et al. | |
| 9,583,247 B2 * | 2/2017 | David | H01F 7/0278 |
| 9,606,190 B2 | 3/2017 | Friedrich et al. | |
| 9,644,999 B2 | 5/2017 | Foletto et al. | |
| 9,664,752 B2 | 5/2017 | Monreal et al. | |
| 9,719,806 B2 * | 8/2017 | Foletto | G01D 5/145 |
| 9,778,326 B2 * | 10/2017 | Chen | G01R 33/0029 |
| 9,797,963 B2 * | 10/2017 | Friedrich | H01F 7/02 |
| 9,841,485 B2 * | 12/2017 | Petrie | G01R 31/2884 |
| 9,999,107 B1 | 6/2018 | Rivas et al. | |
| 10,088,533 B2 * | 10/2018 | Rivas | G01R 33/072 |
| 2005/0016003 A1 | 1/2005 | Klarer | |
| 2007/0176568 A1 | 8/2007 | Robichaux et al. | |
| 2010/0211347 A1 | 8/2010 | Friedrich et al. | |
| 2014/0176126 A1 | 6/2014 | Friedrich et al. | |
| 2015/0288362 A1 | 10/2015 | Lee | |
| 2015/0345990 A1 | 12/2015 | David et al. | |
| 2016/0200245 A1 | 7/2016 | Rivas et al. | |
| 2016/0305795 A1 | 10/2016 | Eisenbeis | |
| 2017/0052038 A1 | 2/2017 | Aichriedler et al. | |
| 2017/0089940 A1 * | 3/2017 | Bussan | G01P 3/44 |

OTHER PUBLICATIONS

Allegro MicroSystems, LLC, "Automotive LED Array Drive;" A6269-DS, Rev. 7; Mar. 1, 2013; 15 Pages.
Allegro MicroSystems, LLC, "Hall-Effect Latch/Bipolar Switch;" A1250-DS, Rev. 4; Apr. 1, 2012; 12 Pages.
Office Action dated Aug. 2, 2017 for U.S. Appl. No. 15/378,702, 12 pages.
Response to Office Action dated Sep. 29, 2017 for U.S. Appl. No. 15/378,702, 15 pages.
Office Action dated Oct. 24, 2017 for U.S. Appl. No. 15/378,702, 16 pages.
Response to Office Action dated Jan. 10, 2018 for U.S. Appl. No. 15/378,702, 10 pages.
Notice of Allowance dated May 16, 2018 for U.S. Appl. No. 15/378,702, 7 pages.

\* cited by examiner

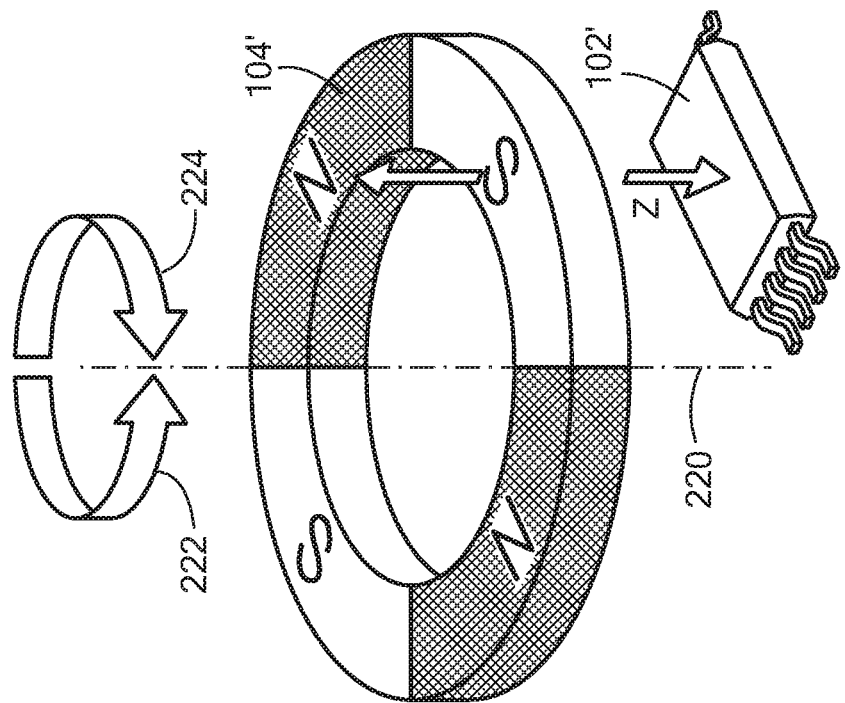
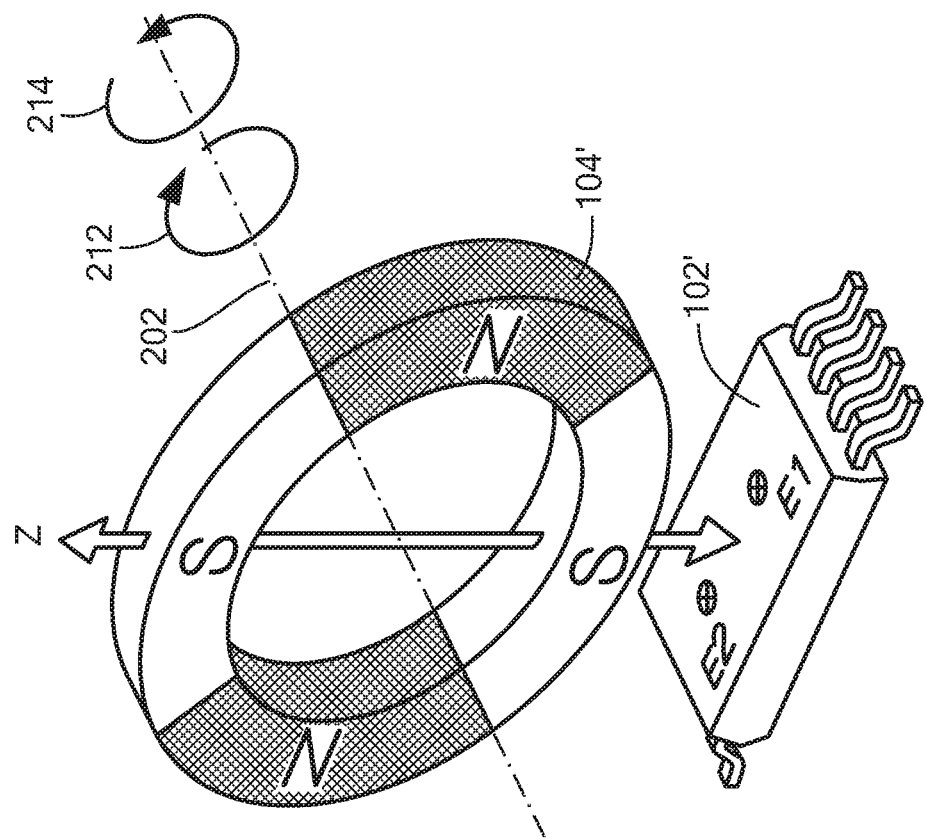
FIG. 2A
FIG. 2B

LIGHT EMITTING DIODE DRIVER FOR DIMMING AND ON/OFF CONTROL

CROSS REFERENCE TO RELATED APPLICATIONS

This is a continuation application of U.S. patent application Ser. No. 15/378,702 (filed Dec. 14, 2016), which is incorporated here by reference in its entirety

BACKGROUND

A mechanical switch may be used to turn on a light, or to take some other electrical power action, in response to a physical state (e.g., a position) of an object. For example, a typical automobile uses a mechanical switch to sense an open door, and in response to closure of the mechanical switch, a light inside the automobile is turned on. Mechanical switches tend to be expensive. Mechanical switches may be subject to wear and corrosion and the mechanical switches may also fail.

SUMMARY

In one aspect, an integrated circuit (IC) includes a first magnetic field sensor configured to sense a ring magnet, a second magnetic field sensor configured to sense the ring magnet and processing circuitry configured to receive a first signal from the first magnetic field sensor and to receive a second signal from the second magnetic field sensor. The processing circuitry is further configured to control an on/off state of at least one light emitting diode (LED) and brightness of the LED based on movement and position of the ring magnet with respect to the first and second magnetic field sensors.

In another aspect, an integrated circuit (IC) includes a first magnetic field sensor configured to sense a ring magnet, a second magnetic field sensor configured to sense the ring magnet and processing circuitry configured to receive a first signal from the first magnetic field sensor and to receive a second signal from the second magnetic field sensor. The processing circuitry is further configured to control current to at least one light emitting diode (LED) in response to movement and position of the ring magnet with respect to the first and second magnetic field sensors.

In one example, an integrated circuit includes a first sensor means for sensing a ring magnet; a second sensor means for sensing the ring magnet and a processing means for controlling current to at least one light emitting diode (LED) in response to movement and position of the ring magnet with respect to the first and second sensor means.

DESCRIPTION OF THE DRAWINGS

FIG. 2A to 2D are diagrams of examples of configurations between the magnet and an integrated circuit (IC).

DETAIL DESCRIPTION

Figure 1A:
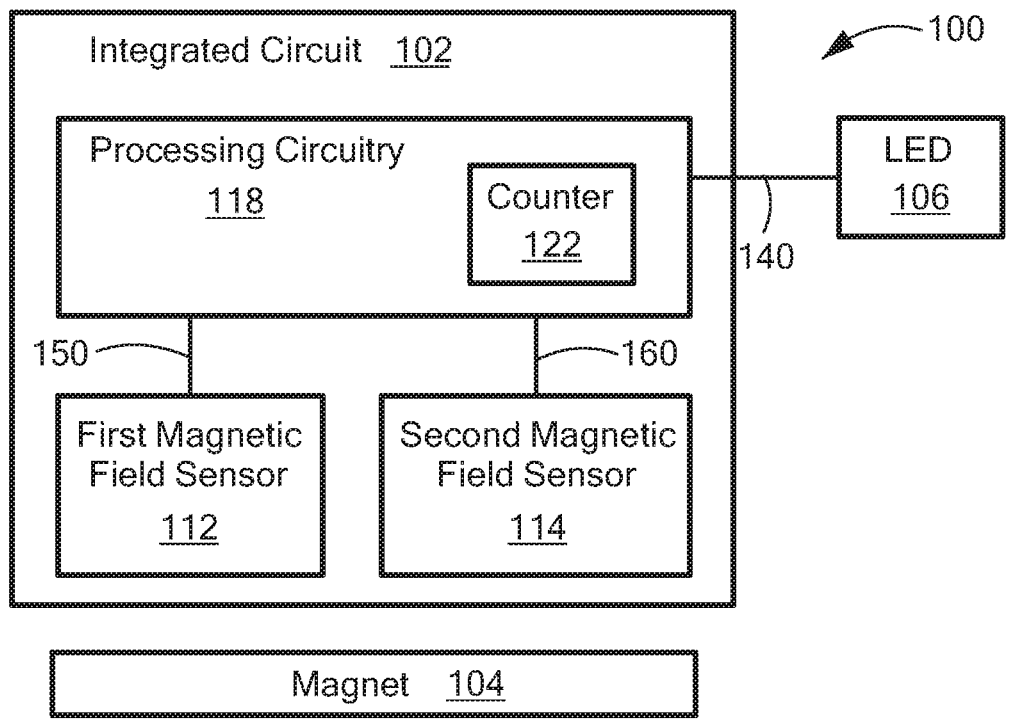
FIG. 1A is a block diagram of an example of a system to control a light emitting diode (LED).

Described herein are techniques to fabricate a driver to control turning on or control turning off a light emitting diode (LED) and to control dimming of the LED. In one example, the LED is used to illuminate an instrument panel (e.g., in a vehicle). In another example, the LED may illuminate an interior of a vehicle (e.g., an automobile, an airplane, a train and so forth). In another example, the driver may be used to control RGB channel selection. While the examples include herein driving a single LED, the techniques described herein may drive more than one LED.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Referring to FIG. 1A, a system 100 is a system to control an LED. The system 100 includes an integrated circuit (IC) 102, an LED 106 and a magnet 104. The IC 102 includes a first magnetic sensor 112, a second magnetic sensor 114 and processing circuitry 118 to drive the LED 106. The processing circuitry 118 may include a counter 122.

In one example, the processing circuitry controls the current to the LED 106. In one example, brightness is increased by increasing the current and brightness is reduced by reducing the current. In one particular example, when no current is supplied to the LED 106, the LED is off and when current is supplied (e.g., above a threshold current level) the LED 106 turns on.

In one example, the first magnetic field sensor 112 may be a vertical sensor or a planar sensor. In one example, the second magnetic field sensor 114 may be a vertical sensor or a planar sensor. In one example a planar sensor includes a planar Hall element. In one example, a vertical sensor includes a vertical Hall element.

While the first and second magnetic field sensors 112, 114 form a dual channel magnetic field sensor, additional magnetic field sensors may be added.

The first and second magnetic field sensors 112, 114 detect a magnetic field produced by the magnet 104 and send a signal to the processing circuitry 118. For example, the first magnetic field sensor 112 sends a signal through a connection 150 to the processing circuitry 118 and the second magnetic field sensor 114 sends a signal through a connection 160 to the processing circuitry 118. As will be further described herein the processing circuitry can turn the LED 106 on or off and dim the LED 106.

The counter 122 is configured either to count up or to count down depending on the direction of rotation of the ring magnet 104'. For example, the counter 122 is incremented for each pole transition detected in a first direction or the counter 122 is decremented for each pole position in the opposite direction detected. A pole transition occurs when the pole closest to the IC 102 transitions to the opposite pole (e.g., North pole region transitions to the South pole region and visa-versa).

Figure 1B:
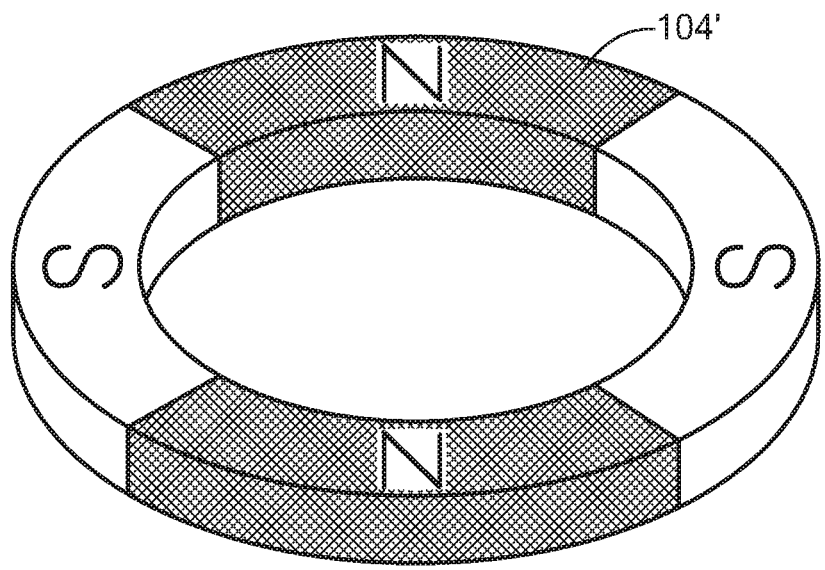
FIG. 1B is a diagram of an example of a ring magnet used to control the LED.

Referring to FIG. 1B, in one example, the magnet 104 may be a ring magnet 104'. While the ring magnet 104' depicts two North (N) pole regions and two South (S) pole regions, other ring magnets may be used that have more or less North and South pole regions. In one particular example, the ring magnet 104' may be placed in or represent a dimming control knob.

Referring to FIG. 2A, in one example of orientation, the ring magnet 104' rotates about an axis of rotation 202 in either a clockwise direction 212 or a counter clockwise direction 214. A Z-axis that is orthogonal to the axis of rotation 202 extends through the center of the ring magnet 104' and further extends to the IC 102', which is an example of the IC 102. In this configuration, the first and second magnetic field sensors 112, 114 may both be planar sensors or one of the first and second magnetic field sensors 112, 114 is a vertical sensor and the other is a planar sensor.

Referring to FIG. 2B, in another example of orientation, the ring magnet 104' rotates about an axis of rotation 220 in either a clockwise direction 224 or a counter clockwise direction 222. A Z-axis extending through the IC 102 extends through a portion of the ring magnet 104'. In this configuration, the first and second magnetic field sensors 112, 114 may both be planars sensor or one of the first and second magnetic field sensors 112, 114 is a vertical sensor and the other is a planar sensor.

Figure 2C:
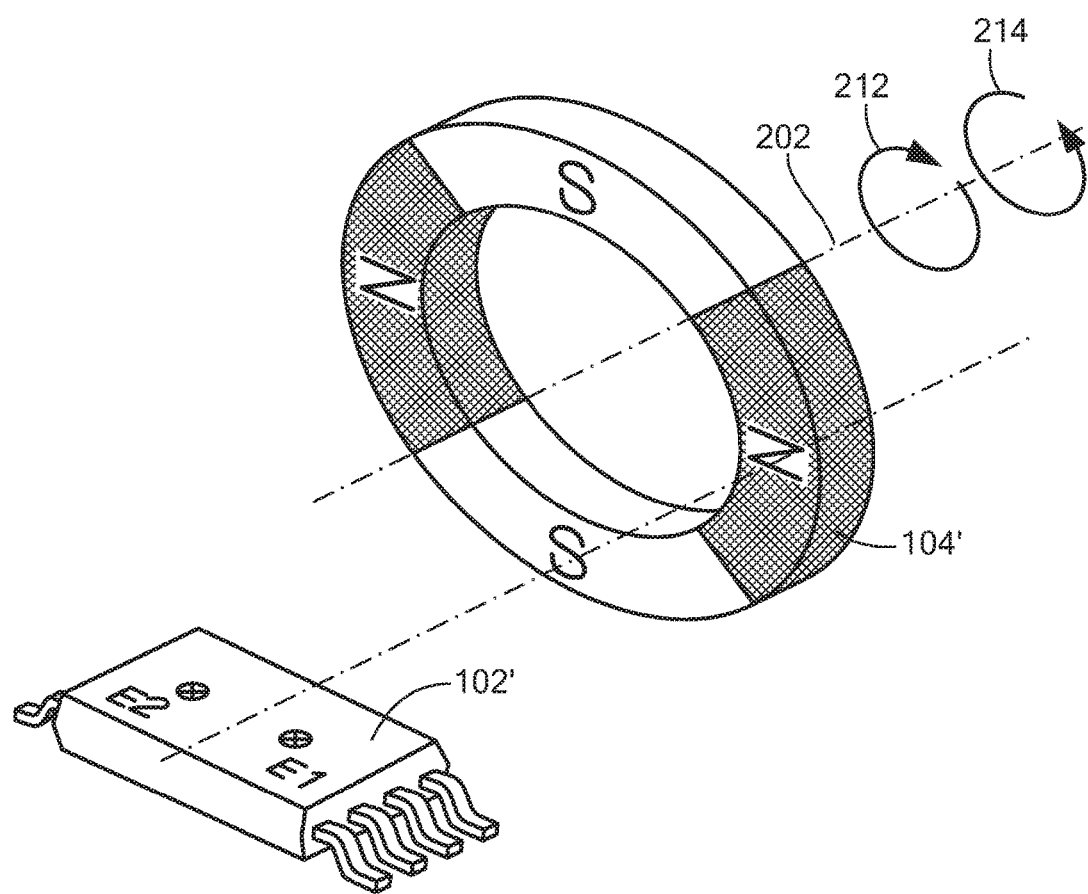
Figure 2D:
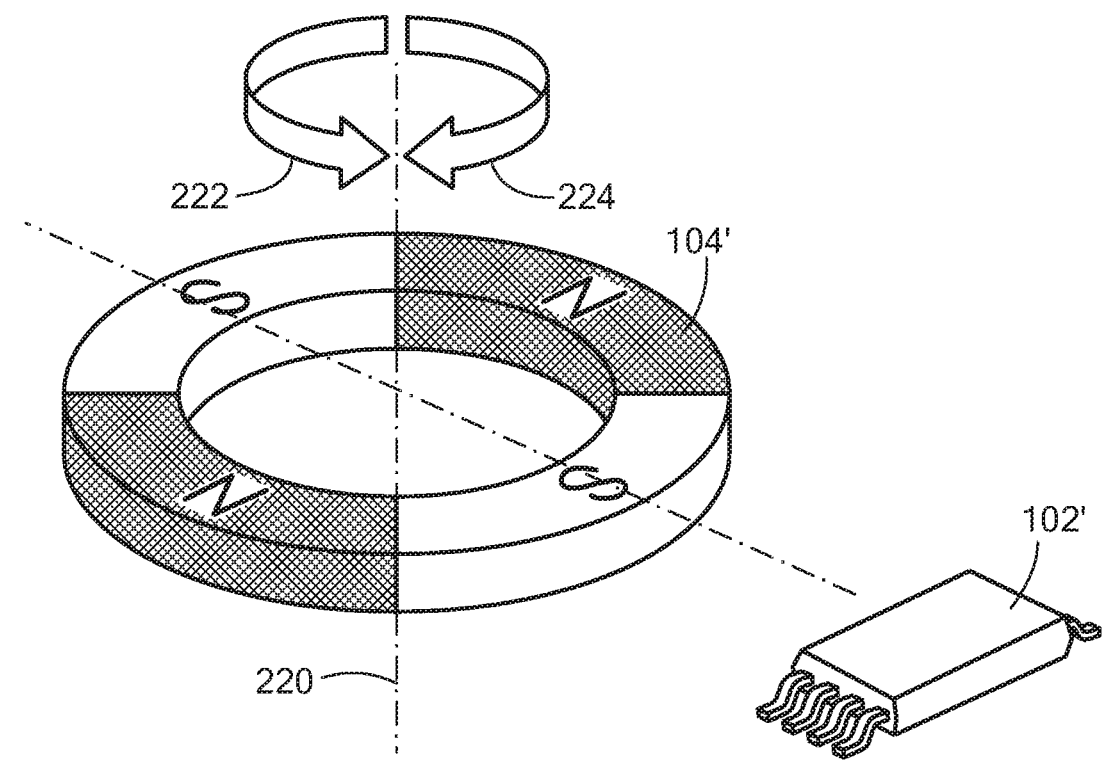

While only two orientations are shown in FIGS. 2A and 2B, other orientations are possible which will limit the type of sensors (planar or vertical) selected for each of the first and second magnetic field sensors 112, 114. For example, referring to FIGS. 2C and 2D, when the magnets are disposed on the edges of the IC 102' instead of being directly over the surface of the IC 102' (as shown in FIGS. 2A and 2B). In the configuration shown in FIGS. 2C and 2D, the first and second magnetic field sensors 112, 114 may both be vertical sensors or one of the first and second magnetic field sensors 112, 114 is a vertical sensor and the other is a planar sensor.

Figure 3:
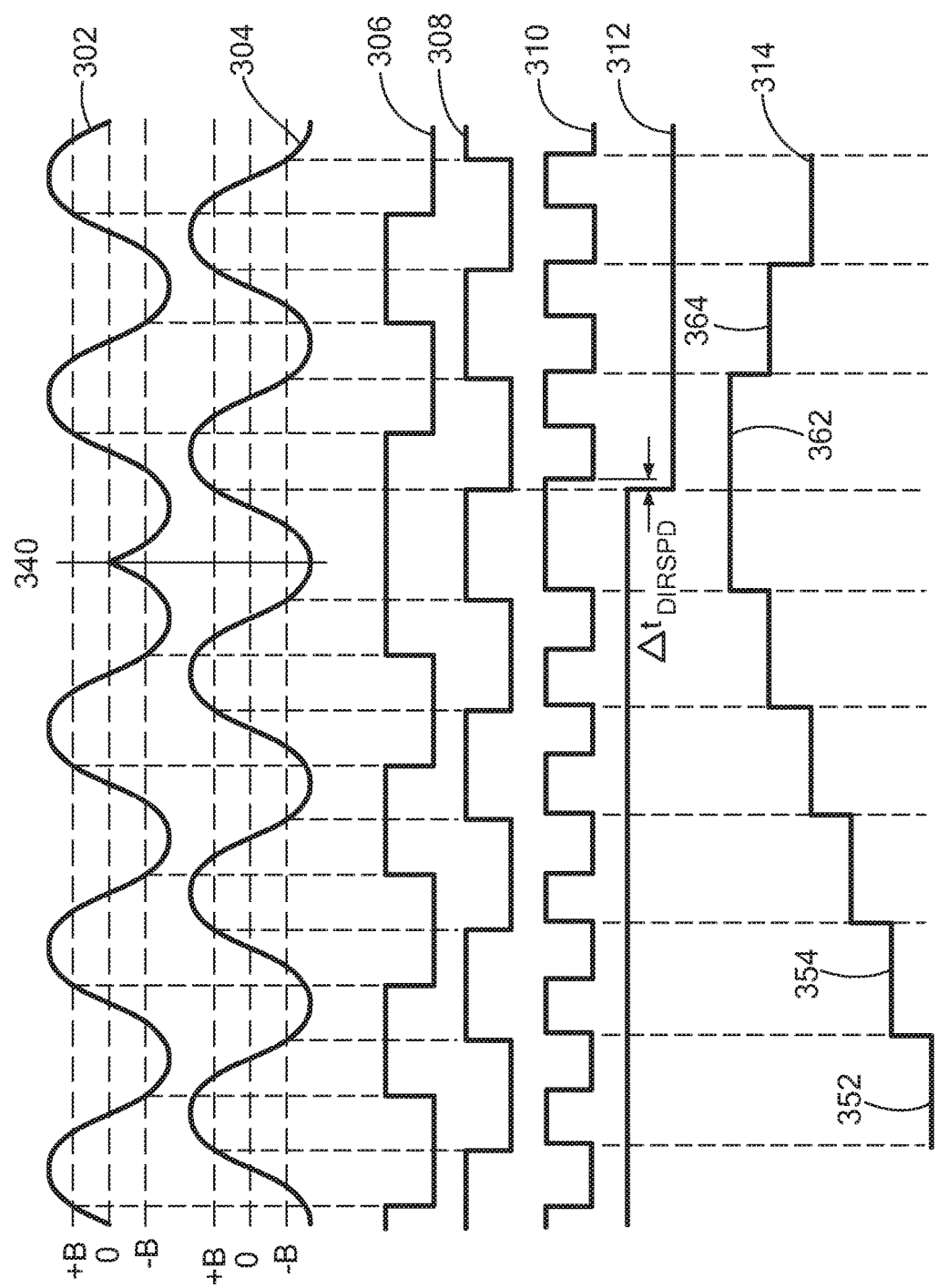
FIG. 3 is a diagram of example waveforms in the system of FIG. 1.

Referring to FIG. 3, a waveform 302 represents the magnetic field detected at one of the two magnetic field sensors (e.g., the first magnetic field sensor 112) and a waveform 304 represents the magnetic field detected at the other one of the magnetic field sensors (e.g., the second magnetic field sensor 112). The waveform 306 represents the output of the first magnetic field sensor 112 sent though the connection 150 to the processing circuitry 118 (FIG. 1A) and the waveform 308 represents the output of the second magnetic field sensor 114 sent though the connection 160 to the processing circuitry 118 (FIG. 1A).

A waveform 310 depicts the speed of the rotation of the ring magnet 102'. The waveform 310 is determined by taking the inverse of the waveform 302 and using an exclusive OR (XOR) function with the waveform 304. The waveform 312 represents the direction of rotation of the ring magnet 102'. The waveform 314 represents the output signal sent through the connection 140 to the LED 106 (FIG. 1A).

The point 340 represents the point where the ring magnet 102' changes direction of rotation. The output waveform 314 increase in steps (corresponding to each pole transition) until the direction changes and decreases in steps (corresponding to each pole transition). For example, after a pole transition the output signal 314 increases in a step fashion from a step 352 to a step 354 and thereby increases the brightness of the LED 106. In another example, after a pole transition the output signal 314 decreases in a step fashion from a step 362 to a step 364 thereby dims the brightness of the LED 106.

In this example, the output waveform 340 responds linearly to pole transition changes. In other examples, the output waveform may respond exponentially to changes in the counter 122.

Figure 4:
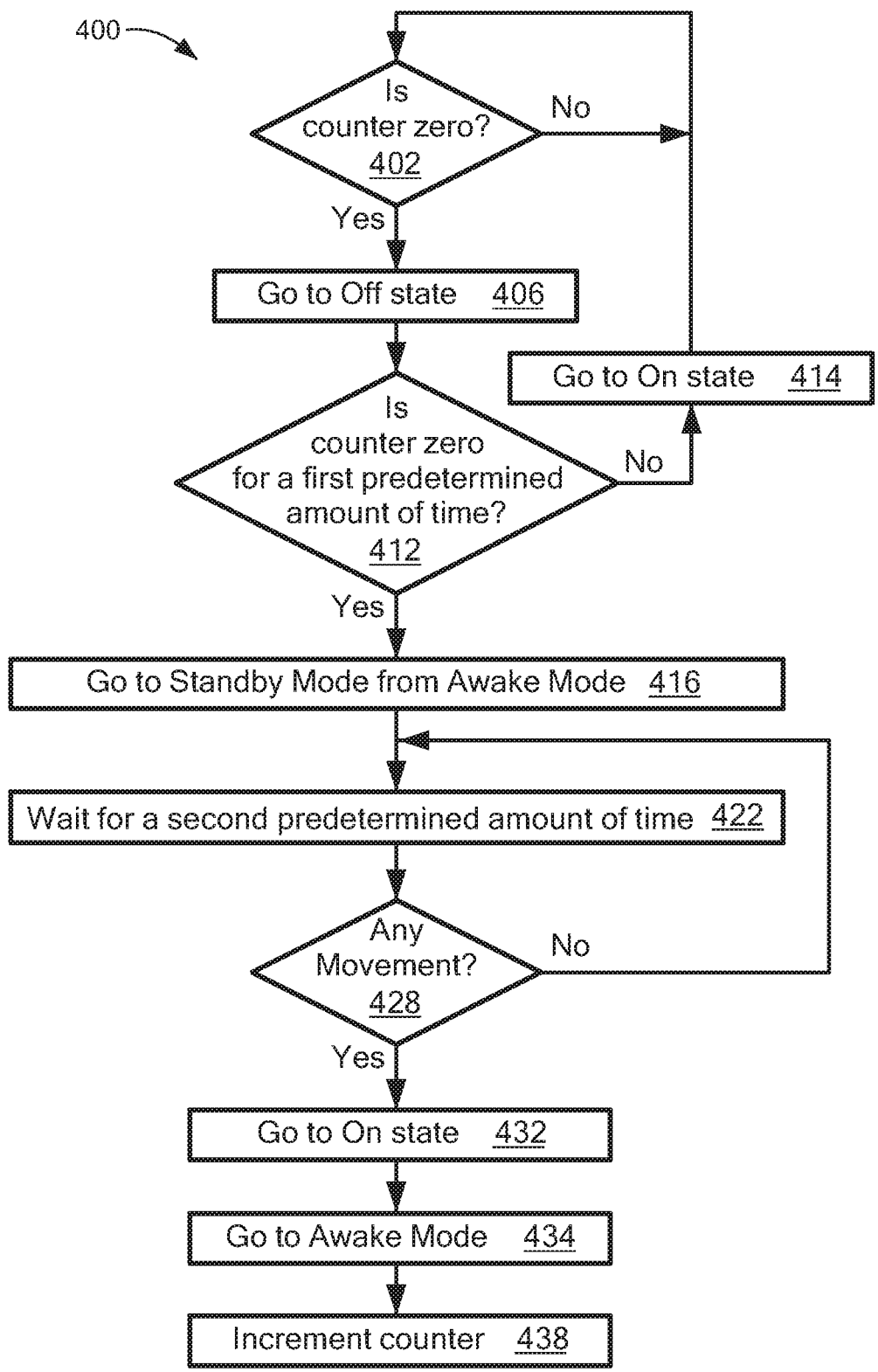
FIG. 4 is a flowchart of an example of a process to control turning the LED on and off.

Referring to FIG. 4, an example of a process to turn on and turn off an LED 106 is a process 400. In one example, the processing circuitry 118 performs the process 400.

Process 400 determines if the counter 122 is at zero (402) and if the counter 122 is at zero process 400 goes to an off state (406) and turns the LED 106 off. The IC 102 remains in an Awake mode consuming, for example, less power.

Process 400 determines if the counter 122 is zero for a first predetermined amount of time (406). The first predetermined amount of time may be programmed into the IC 102 or set external to the IC 102. If the counter 122 is no longer is zero, process 400 goes to an on state and the LED 106 is tuned on.

If the counter 122 is zero for the first predetermined amount of time, the process 400 goes from an Awake mode to a standby mode (416). In a Standby mode the IC 102 consumes less power than in processing block 406.

Process 400 waits a second predetermined amount of time (422). The second predetermined amount of time may be programmed into the IC 102 or set external to the IC 102.

Process 400 determines if there has been any movement of the ring magnet 104' (428). For example, the outputs of magnetic field sensor 112, 114 are compared to previous recorded outputs.

If the ring magnet 104' has been determined to have moved, process 400 goes to an on state (432) by turning the LED 106 on, goes to awaken mode (434) by drawing more power and increments the counter 122 (438) from zero to one, for example.

Figure 5:
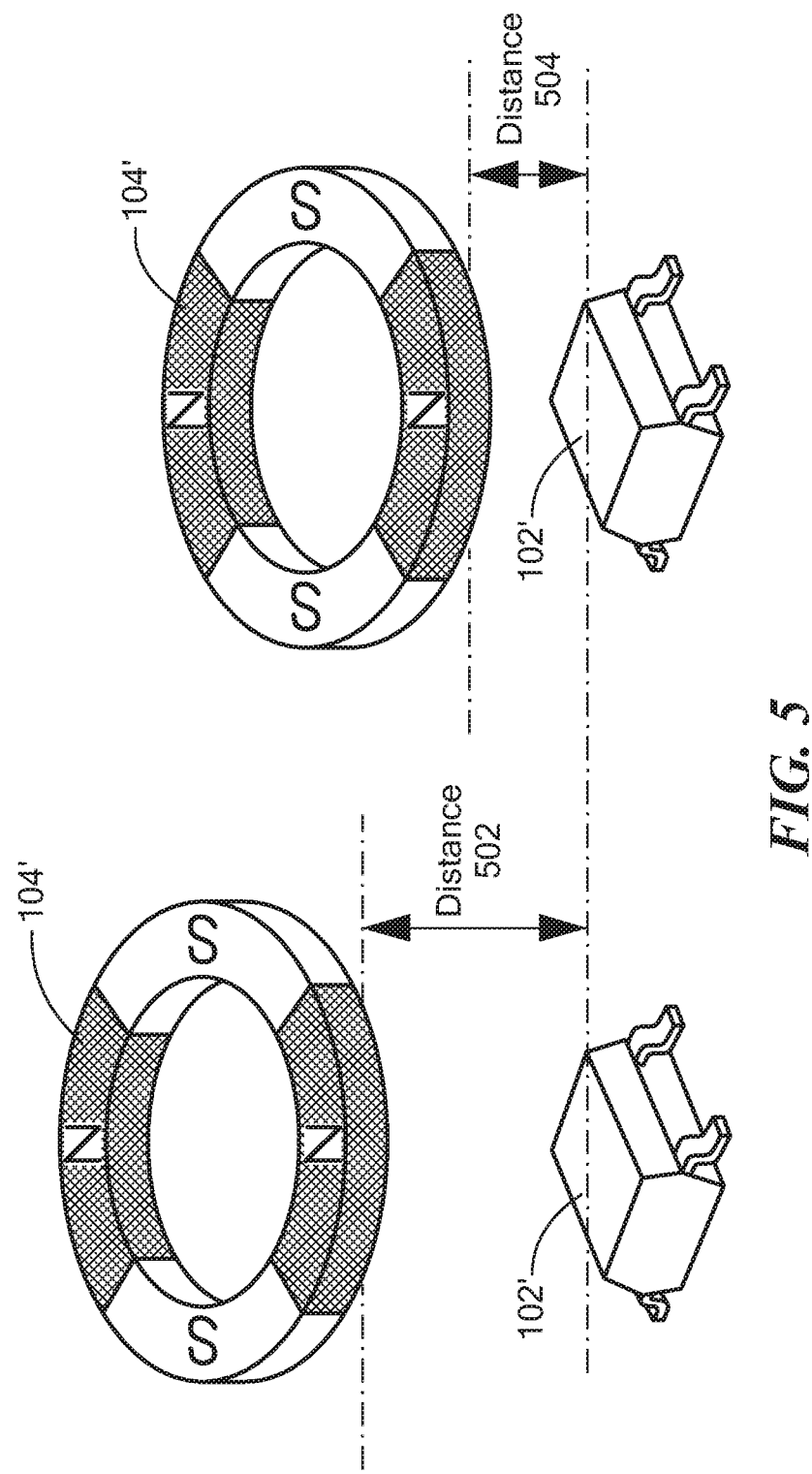
FIG. 5 is a diagram of the ring magnet and two different distances the ring magnet may be from the IC.
Figure 6:
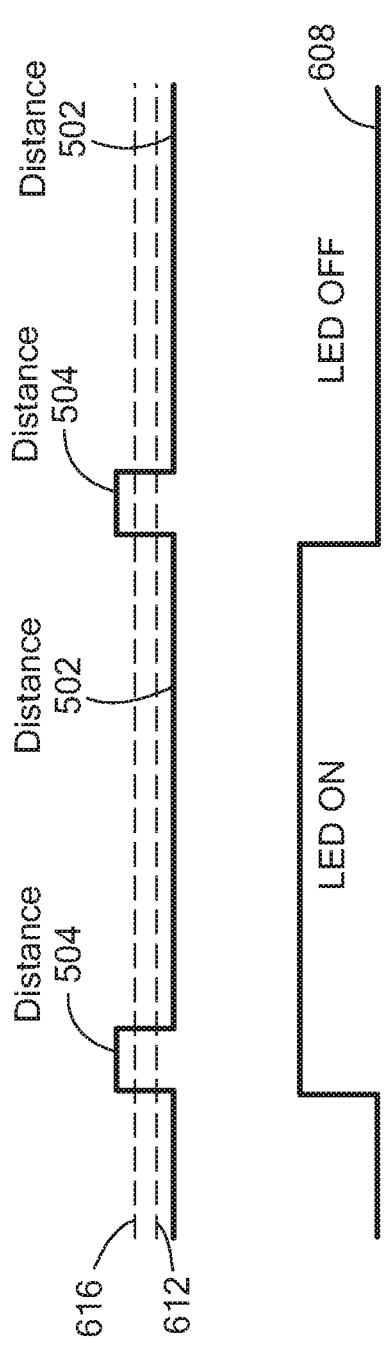
FIG. 6 is a diagram of an example of push activation of the LED.
Figure 7:
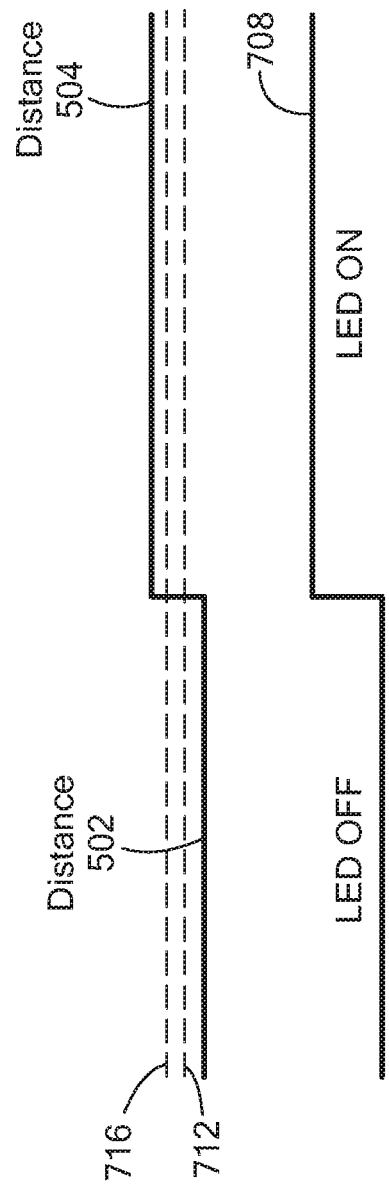
FIG. 7 is a diagram of an example of position activation of the LED.

Referring to FIG. 5, the LED may be turned on and off using other examples such as using push activation (FIG. 6) or by position activation (FIG. 7). For example, the on/off mechanism is triggered depending on if a ring magnet 104' is a distance 502 away from the IC 102' or a distance 504 close to the IC 102'.

Referring to FIG. 6, in a push activation, initially when the ring magnet 104' is greater than a first threshold distance 612 at a distance 502 the LED 106 is off. When the ring magnet 104' is moved closer to the IC 102' and is pushed to the distance 504, which is below a second threshold distance 616, a waveform 608 corresponding to the output waveform of the IC 102' goes from low to high and the LED 106 turns on and remains on even when the ring magnet 104' is returned to the distance 504. When the ring magnet 104' is moved again closer to the IC 102' and is pushed to the distance 504, which is below the second threshold distance 616, the waveform 608 goes low and the LED 106 turns off.

Referring to FIG. 7, in a position activation, when the ring magnet 104' is greater than a first threshold distance 712 at a distance 502, a waveform 708 corresponding to the output waveform of the IC 102' is low and the LED 106 is off. When the ring magnet 104' is moved closer to the IC 102' and is pushed to the distance 504, which is below a second threshold distance 716, the waveform 708 goes from low to high and the LED 106 turns on.

The processes described herein (e.g., process 400) are not limited to use with the hardware of FIG. 1; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The processing blocks (for example, in the process 400) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, a programmable logic device or a logic gate.

The processes described herein are not limited to the specific examples described. For example, the process 400 is not limited to the specific processing order of FIG. 4. Rather, any of the processing blocks of FIG. 4 may be re-ordered, combined or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An integrated circuit (IC) comprising:
a first magnetic field sensor configured to sense a magnet;
a second magnetic field sensor configured to sense the magnet; and
processing circuitry configured to:
receive a first signal from the first magnetic field sensor, wherein the first signal is based upon movement and position of the magnet with respect to the first magnetic field sensor;
receive a second signal from the second magnetic field sensor, wherein the second signal is based upon movement and position of the magnet with respect to the second magnetic field sensor; and
control an on/off state and brightness of a light emitting diode (LED) based on the received first and second signals.

2. The IC of claim 1, wherein the processing circuitry is configured to hold the LED in an off state while the magnet is at a distance from the IC greater than a threshold distance.

3. The IC of claim 2, wherein the LED is turned on when the magnet moves to a distance from the IC less than the threshold distance from the distance greater than the threshold distance.

4. The IC of claim 3, wherein the processing circuitry is configured to hold the LED in an on state when the magnet returns to the distance from the IC greater than the threshold distance from the distance less than the threshold distance.

5. The IC of claim 4, wherein the LED is turned off when the magnet moves to a distance from the IC less than the threshold distance from the returned to distance greater than the threshold distance.

6. The IC of claim 2, wherein a waveform corresponding to an output waveform of the IC goes from low to high when the magnet moves to a distance from the IC less than the threshold distance from the distance greater than the threshold distance.

7. The IC of claim 1, wherein the LED is turned on if the magnet is a first distance from the IC.

8. The IC of claim 7, wherein the LED is turned off if the magnet is a second distance from the IC.

9. The IC of claim 1, wherein the first magnetic field sensor and the second magnetic field sensor are both planar magnetic field sensors.

10. The IC of claim 9, wherein at least one of the planar magnetic field sensors is a planar Hall element.

11. The IC of claim 1, wherein the first magnetic field sensor and the second magnetic field sensor are both vertical magnetic field sensors.

12. The IC of claim 11, wherein at least one of the vertical magnetic field sensors is at least one of vertical Hall element, a giant magnetoresistance (GMR) element, an anisotropic magnetoresistance element (AMR) and a tunneling magnetoresistance (TMR) element.

13. The IC of claim 1, wherein one of the first magnetic field sensor and the second magnetic field sensor is a vertical magnetic field sensor and the other one of the first magnetic field sensor and the second magnetic field sensor is a planar magnetic field sensor.

14. The IC of claim 13, wherein the planar magnetic field sensor is a planar Hall element, and
wherein the vertical magnetic field sensor is at least one of vertical Hall element, a giant magnetoresistance (GMR) element, an anisotropic magnetoresistance element (AMR) and a tunneling magnetoresistance (TMR) element.

15. The IC of claim 1, further comprising a third magnetic field sensor configured to sense a magnet,
wherein processing circuitry is further configured to receive a third signal from the third magnetic field sensor and to control an on/off state of a light emitting diode (LED) and brightness of the LED based on movement and position of the magnet with respect to the first, second and third magnetic field sensors.

16. An integrated circuit (IC) comprising:
a first magnetic field sensor configured to sense a magnet;
a second magnetic field sensor configured to sense the magnet; and
processing circuitry configured to:
receive a first signal from the first magnetic field sensor, wherein the first signal changes in response to movement and position of the magnet with respect to the first magnetic field sensor;
receive a second signal from the second magnetic field sensor, wherein the second signal changes in response to movement and position of the magnet with respect to the second magnetic field sensor; and
control current to at least one light emitting diode (LED) based on the received first and second signals.

17. The IC of claim 16, wherein the LED is off if the current supplied to the LED is zero.

18. The IC of claim 16, wherein a waveform corresponding to an output waveform of the IC is low when the magnet is at a distance from the IC greater than a first threshold distance.

19. The IC of claim 18, wherein the waveform is high when the magnet is at a distance from the IC less than a second threshold distance.

20. An integrated circuit (IC) comprising:
a first sensor means for sensing a magnet;
a second sensor means for sensing the magnet; and
processing means for controlling current to at least one light emitting diode (LED) in response to movement and position of the magnet with respect to the first and second sensor means, wherein the processing means is configured to hold the at least one LED in an off state while the magnet is at a distance from the IC greater than a threshold distance.

* * * * *

UNITED STATES PATENT AND TRADEMARK OFFICE
CERTIFICATE OF CORRECTION

Page 1 of 1

PATENT NO. : 10,219,344 B2
APPLICATION NO. : 15/957004
DATED : February 26, 2019
INVENTOR(S) : Manuel Rivas et al.

It is certified that error appears in the above-identified patent and that said Letters Patent is hereby corrected as shown below:

In the Specification

Column 1, Line 60, delete "FIG. 2A to 2D" and replace with --FIGS. 2A to 2D--

Column 4, Line 20, delete "112 sent though" and replace with --112 sent through--

Column 4, Line 23, delete "114 sent though" and replace with --114 sent through--

Column 4, Line 34, delete "increase in steps" and replace with --increases in steps--

Column 4, Line 59, delete "longer is zero" and replace with --longer zero--

Column 4, Line 60, delete "106 is tuned on" and replace with --106 is turned on--

Signed and Sealed this
Fourth Day of June, 2019

Andrei Iancu
*Director of the United States Patent and Trademark Office*